US012648450B2

(12) United States Patent
Lai et al.

(10) Patent No.: US 12,648,450 B2
(45) Date of Patent: Jun. 2, 2026

(54) SEMICONDUCTOR DEVICE, METHOD OF FORMING THE SAME AND METHOD OF MEASURING THE SAME

(71) Applicant: Fujian Jinhua Integrated Circuit Co., Ltd., Quanzhou City (CN)

(72) Inventors: Jianpeng Lai, Quanzhou City (CN); Rongxiang Zhong, Quanzhou City (CN); Yue Liu, Quanzhou City (CN); Chung-Ping Hsia, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 366 days.

(21) Appl. No.: 18/242,513

(22) Filed: Sep. 5, 2023

(65) Prior Publication Data

US 2024/0387395 A1     Nov. 21, 2024

(30) Foreign Application Priority Data

May 18, 2023     (CN) .......................... 202310567962.4
May 18, 2023     (CN) .......................... 202321211372.X

(51) Int. Cl.
*H01L 23/544*     (2006.01)
*H01L 21/3213*     (2006.01)
*H01L 21/66*     (2006.01)

(52) U.S. Cl.
CPC ...... *H01L 23/544* (2013.01); *H01L 21/32139* (2013.01); *H01L 22/12* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 11,302,712 B2 | 4/2022 | Tiwari | |
| 2012/0049186 A1 | 3/2012 | Li | |
| 2015/0155257 A1* | 6/2015 | Koketsu | .................. H01L 21/00 |
| | | | 438/15 |
| 2015/0311162 A1* | 10/2015 | Chen | ................. H01L 21/76837 |
| | | | 438/622 |
| 2017/0125300 A1* | 5/2017 | Kim | ................... H10D 84/0135 |
| 2018/0025991 A1* | 1/2018 | Koketsu | .................. H01L 24/29 |
| | | | 438/462 |
| 2020/0126881 A1* | 4/2020 | Liao | .................. H01L 23/49822 |

FOREIGN PATENT DOCUMENTS

| | | |
|---|---|---|
| JP | 2007-123781 A | 5/2007 |
| KR | 10-2009-0071740 A | 7/2009 |
| TW | 202145494 A | 12/2021 |

* cited by examiner

*Primary Examiner* — Khaja Ahmad
(74) *Attorney, Agent, or Firm* — Winston Hsu

(57)     ABSTRACT

A semiconductor device, a method of forming the same and a method of measuring the same are disclosed. The semiconductor device includes a substrate, a first dielectric layer, first alignment marks, a second dielectric layer and second alignment marks. The first dielectric layer is arranged on the substrate, the first alignment marks are arranged in the first dielectric layer. The second dielectric layer is disposed on the first dielectric layer. The second alignment marks are arranged in the second dielectric layer and spaced apart from each other, each having a stepped structure. The first and second alignment marks do not interfere with each other. A precisely positioned interconnection structure can thus be defined in the semiconductor device.

8 Claims, 9 Drawing Sheets

SEMICONDUCTOR DEVICE, METHOD OF FORMING THE SAME AND METHOD OF MEASURING THE SAME

BACKGROUND OF THE INVENTION

1. Field of the Invention

The present invention generally relates to a semiconductor device, a method of forming the same and a method of measuring the same, and more particularly to a semiconductor device having an alignment mark, a method of forming the same and a method of measuring the same.

2. Description of the Prior Art

Photolithography is an important process for manufacturing a semiconductor device. Exposure and development are used to transfer a design pattern to the photoresist layer. Then the photoresist layer is used as an etching mask to etch a material layer thereunder, so as to transfer the design pattern required for a circuitry down to the material layer. A semiconductor manufacturing process is generally performed to implement an integrated circuit structure of a semiconductor device by repeating deposition, lithography and etching processes layer by layer. However, as pattern designs of circuitry become more and more meticulous and compact, the specification regarding alignment between upper and lower layers of a circuit structure becomes more and more critical. Even a slight deviation from designed alignment may lead to defects such as abnormal contact, short circuit or disconnection of the integrated circuit structure. Therefore, it is necessary to further modify the manufacturing process and design of alignment marks of a semiconductor device in order to effectively improve the efficiency and reliability of the semiconductor device.

SUMMARY OF THE INVENTION

An object of the present invention is to provide a semiconductor device and a method of forming the same. By forming alignment marks with stepped structures in an area, it can be ensured that the interconnection structures in another area are formed at predetermined positions. Accordingly, the semiconductor device of the present invention has advantages of high structural integrity, improved operational performance, and so on.

Another object of the present invention is to provide a method of measuring a semiconductor device. In the method, the alignment marks with stepped structures are inspected to check the positions of the alignment marks on an area of the substrate, thereby ensuring that the interconnection structures in another area can be formed at predetermined positions.

In order to achieve the above object, the present invention provides a semiconductor device, which includes a substrate, a first dielectric layer, a plurality of first alignment marks, a second dielectric layer and a plurality of second alignment marks. The first dielectric layer is arranged on the substrate. The first alignment marks are arranged in the first dielectric layer and have a plurality of first lateral edges along a first direction. The second dielectric layer is disposed on the first dielectric layer. The second alignment marks are arranged in the second dielectric layer and spaced apart from each other. Each of the second alignment marks has a stepped structure. The stepped structure has a plurality of second lateral edges along the first direction, and the plurality of second lateral edges are disposed between adjacent two of the plurality of first lateral edges in the first direction.

In order to achieve the above object, the present invention provides a method of forming a semiconductor device, which includes the following process. A substrate is provided. A first dielectric layer is formed on the substrate. A plurality of first alignment marks are formed in the first dielectric layer and have a plurality of first lateral edges along a first direction. A plurality of second alignment marks are formed on the first dielectric layer, wherein the second alignment marks are spaced apart from each other, and each of the second alignment marks has a stepped structure. The stepped structure has a plurality of second lateral edges along the first direction, and the plurality of second lateral edges are disposed between adjacent two of the plurality of first lateral edges in the first direction. A second dielectric layer is formed to cover the second alignment marks.

In order to achieve the above object, the present invention provides a method for measuring a semiconductor device. The method includes the following processes. A semiconductor structure, which includes a substrate, a plurality of alignment marks arranged on the substrate, and a plurality of stepped structures arranged on the alignment marks, is provided. The semiconductor structure is inspected with an inspection machine. The positions of the alignment marks and the stepped structures on the substrate are defined.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1B is a schematic diagram illustrating a cross-sectional view of a part of the semiconductor device illustrated in FIG. 1A.

FIG. 2 to FIG. 4 are schematic diagrams illustrating a method of forming the semiconductor device of the first embodiment of the present invention, wherein:

FIG. 2 is a cross-sectional view of the semiconductor device after forming a metal layer;

FIG. 3 is a cross-sectional view of the semiconductor device after an etching process; and FIG. 4 is a cross-sectional view of the semiconductor device after a trim-etching process.

FIGS. 8 and 9 are schematic diagrams illustrating cross-sectional views of a semiconductor device according to a fifth embodiment of the present invention, wherein:

FIG. 8 is a cross-sectional view of the semiconductor device of the fifth embodiment of the present invention; and FIG. 9 is another cross-sectional view of the semiconductor device of the fifth embodiment of the present invention.

FIGS. 11 and 12 are schematic diagrams illustrating a method of measuring a semiconductor device according to a preferred embodiment of the present invention, wherein:

FIG. 11 is a scheme illustrating a flow chart of the method of measuring a semiconductor device; and FIG. 12 is a scheme illustrating the inspecting process a semiconductor device.

DETAILED DESCRIPTION

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1A:
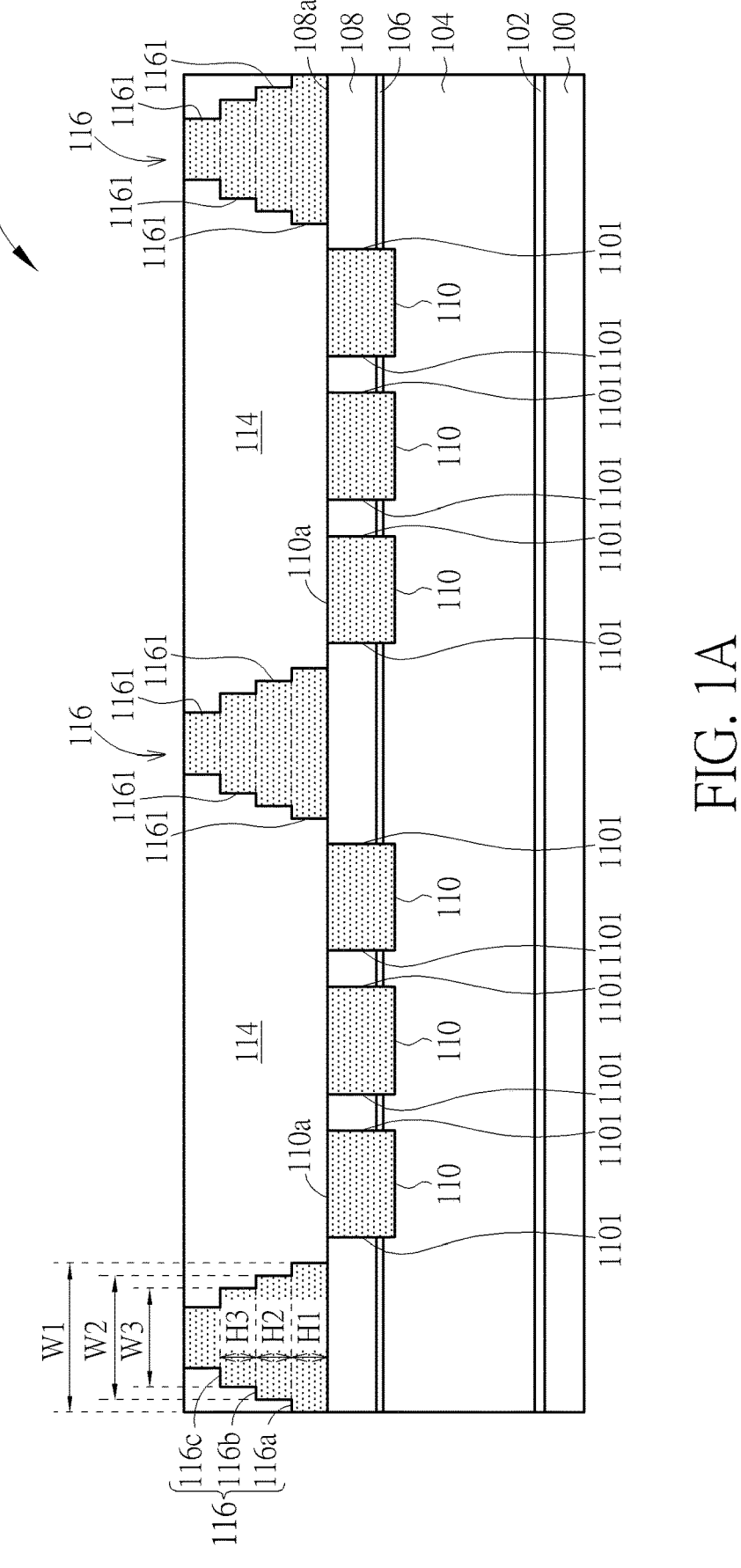
FIG. 1A is a schematic diagram illustrating a cross-sectional view of a semiconductor device according to a first embodiment of the present invention.

FIG. 1A shows a schematic cross-sectional view of a semiconductor device 10 in a first embodiment of the present invention. The semiconductor device 10 includes a substrate 100, such as, but not limited to, a silicon substrate, a silicon-containing substrate, an epitaxial silicon substrate, a silicon-on-insulator substrate or any other suitable material. A dielectric layer 102, a dielectric layer 104, an etch stop layer 106 and a dielectric layer which is also referred to as a first dielectric layer 108, are sequentially disposed on the substrate 100. It should be noted that a plurality of first alignment marks 110 are disposed in the first dielectric layer 108, the etch stop layer 106 and partially the dielectric layer 104 on the substrate 100 and spaced apart from each other. The top surfaces 110a of the first alignment marks 110 are made coplanar with the top surfaces 108a of the first dielectric layer 108 and at a common plane 108a/110a. Furthermore, the substrate 100 is also provided with a dielectric layer which is also referred to as a second dielectric layer 114, and a plurality of second alignment marks 116. The second dielectric layer 114 is disposed on the first dielectric layer 108. The second alignment marks 116 are disposed in the second dielectric layer 114 and spaced apart from each other. The second alignment marks 116 are located on the common plane 108a/110a of the first alignment marks 110 and the first dielectric layer 108, with each of that has a stepped structure. In this embodiment, the second alignment marks 116 are in physical contact with the top surface 108a of the first dielectric layer 108 and do not overlap the plurality of first alignment marks 110 in the lower layer, as illustrated in FIG. 1A. That is, a plurality of first alignment marks 110 are disposed between two adjacent second alignment marks 116 so that their top surfaces 110a only contact the second dielectric layer 114.

The dielectric layer 102, the dielectric layer 104, the etch stop layer 106, the first dielectric layer 108 and the second dielectric layer 114 respectively includes a dielectric material, such as silicon oxide ($SiO_2$), silicon nitride (SiN), silicon oxynitride (SiON) or silicon carbonitride (SiCN), etc. The first alignment marks 110 and the second alignment marks 116 includes, for example, but not limited to, tungsten (W) and copper (Cu), aluminum (Al), Titanium (Ti), Tantalum (Ta) or any other suitable low-resistivity metal material. In this embodiment, the dielectric layer 102 and the etch stop layer 106 preferably include the same material, such as silicon nitride, while the dielectric layer 104, the first dielectric layer 108 and the second dielectric layer 114 preferably include the same material, such as silicon oxide, which is different from the material of the dielectric layer 102 and the etch stop layer 106, but not limited thereto.

In detail, the stepped structure of one or each of the second alignment marks 116, for example, includes a plurality of steps 116a, 116b and 116c, and the number of steps 116a, 116b and 116c can be specifically adjusted according to practical requirements on the device without being limited to the example shown in FIG. 1A. In an embodiment, the widths W1, W2 and W3 of the steps 116a, 16b and 116c defined in the horizontal direction, i.e., the direction parallel to the top surface of the substrate 100, gradually decrease from bottom to top. Meanwhile, the heights H1, H2 and H3 of the steps 116a, 116b and 116c defined in the vertical direction, i.e., the direction perpendicular to the top surface of the substrate 100, may be the same as or different from one another without specific limitation.

Under this arrangement, the first alignment marks 110 have a plurality of first lateral edges 1101 along the horizontal direction. Each stepped structure of the second alignment marks 116 has a plurality of second lateral edges 1161 along the horizontal direction. The plurality of second lateral edges 1161 are disposed between adjacent two of the plurality of first lateral edges 1101 in the horizontal direction. The arranged positions of the first alignment marks 110 and the second alignment marks 116 of the semiconductor device 10 in this embodiment do not overlap and do not interfere with each other. The first alignment marks 110 are used as zero-layer marks or outer marks of the semiconductor device 10, which allow other alignment marks (not shown) that need to be formed in subsequent process(s) to be aligned with. On the other hand, the second alignment marks 116 are used as inner marks of the semiconductor device 10 to ensure that the subsequently formed interconnection structure can be formed at the predetermined positions. Therefore, the semiconductor device 10 in this embodiment can have an accurately positioned interconnection structure (not shown in the drawings), thereby enhancing the operational performance of the semiconductor device 10.

In order to make those ordinary in the art to which the present invention belongs readily understand the semiconductor device 10 of the present invention, a method of forming the semiconductor device 10 according to the present invention will be further described hereinafter. Since the semiconductor device 10 shown in FIG. 1A includes repetitive structures, a partial structure of the semiconductor device 10 is extracted and shown in FIG. 1B for subsequently illustrating the method of forming the semiconductor device 10 in a simplified manner.

Figures 1B, 2:
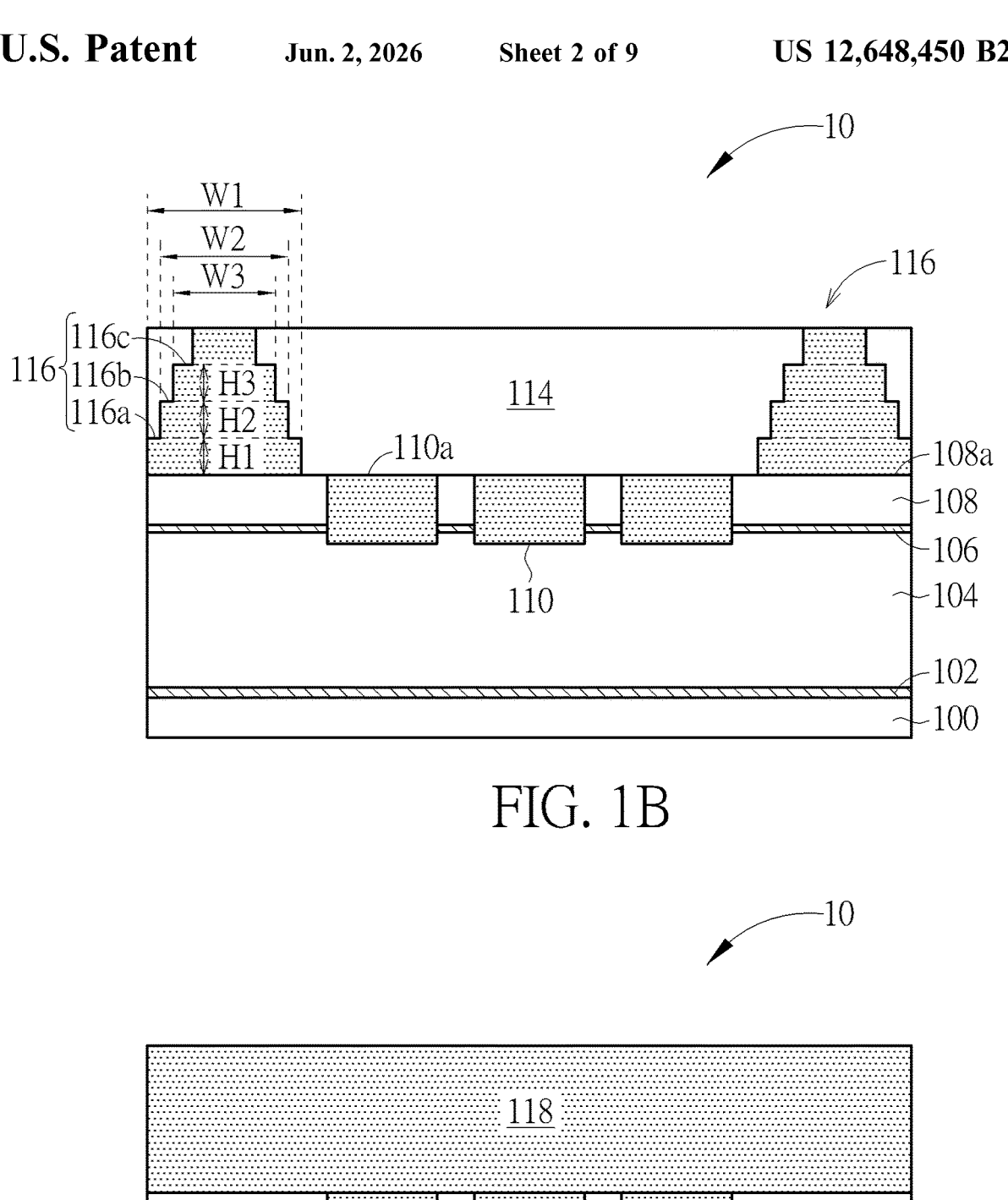
Figure 3:
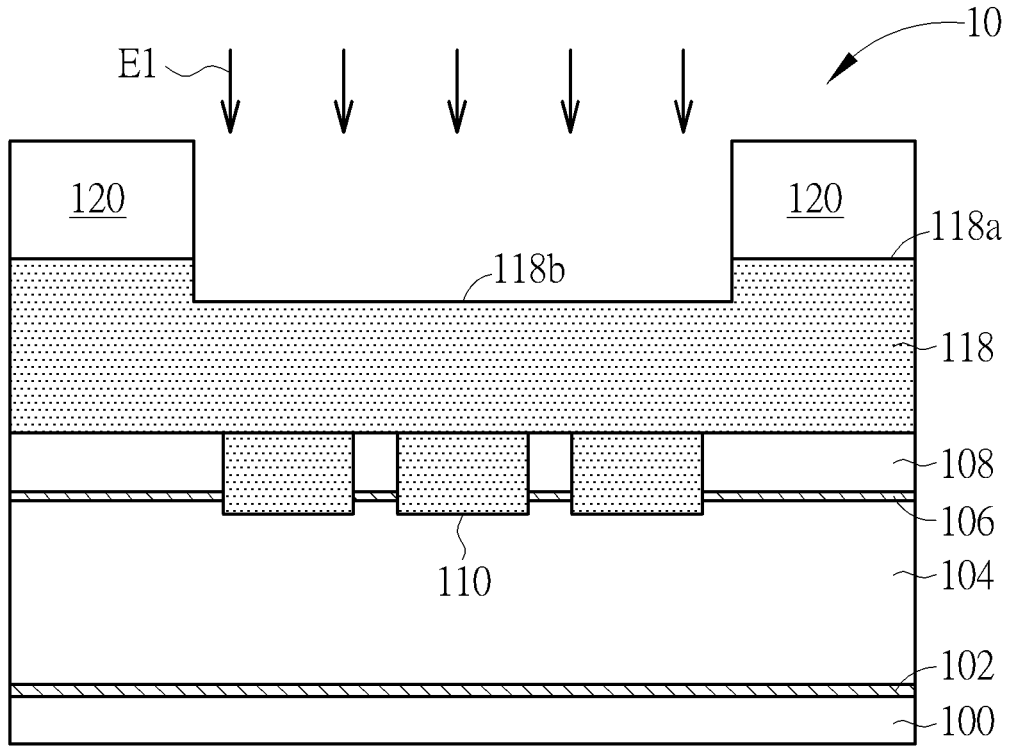
Figure 4:
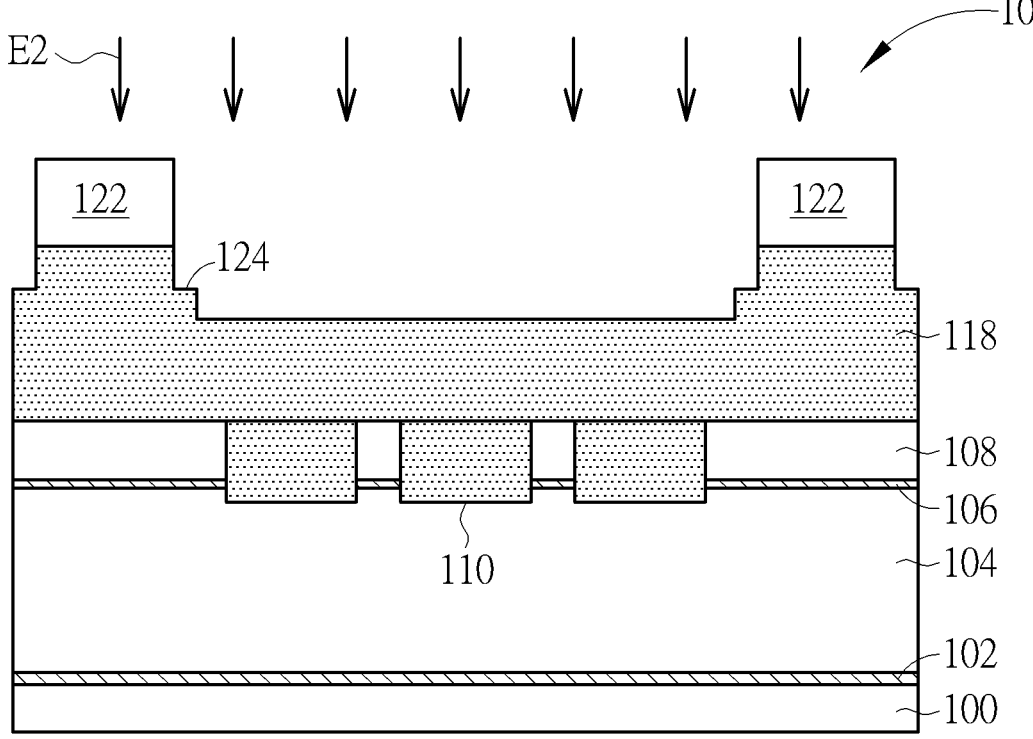

Please refer to FIG. 2 to FIG. 4, which are schematic diagrams illustrating a method of forming the semiconductor device 10 according to the first embodiment of the present invention and taken from the partial structure shown in FIG. 1B. First, as shown in FIG. 2, the substrate 100 is provided, and the dielectric layer 102, the dielectric layer 104, the etch stop layer 106 and the first dielectric layer 108 are sequentially formed on the substrate 100. Next, an etching process is performed through a mask layer (not shown) to form a plurality of via holes (not shown) in the first dielectric layer 108, wherein each via hole sequentially penetrates through the first dielectric layer 108 and the etch stop layer 106, and partially exposes the dielectric layer 104. Then, the mask layer is completely removed, and the via holes are filled with a metal material, such as tungsten, copper, aluminum, titanium, tantalum or any other suitable low-resistance metal material, to form the first alignment marks 110. In an embodiment, the formation of the first alignment mark 110 can be integrated into the manufacturing process of the interconnection structure, which is in an area other than the area of the first alignment marks 110. For example, it may be integrated into the process for forming the interconnect structures in the dielectric layer 102, the dielectric layer 104, the etch stop layer 106 and the first dielectric layer 108, but it is not limited thereto. Subsequently, a metal layer 118 is formed on the first alignment marks 110 and the first dielectric layer 108 to cover the entire substrate 100. The metal layer 118 also includes, for example, tungsten, copper, aluminum, titanium, tantalum or any other suitable low-resistance metal material, but it is not limited thereto.

Referring to FIG. 3, a mask layer 120 is formed on the substrate 100, partially covering the metal layer 118 to expose a portion of the top surface 118a of the metal layer 118, and a first etching process E1, e.g., dry etching and/or wet etching process, is performed to partially remove the exposed metal layer 118 by using the mask layer 120 as an etching mask, thereby obtaining a depressed top surface 118b. The depressed top surface 118b is lower than the top surface 118a of the metal layer 118 in the vertical direction. In an embodiment, the first etching process E1 preferably includes an anisotropic etching process, but it is not limited thereto.

Referring to FIG. 4, a trim-etching process E2 is performed on the metal layer 118. In detail, the trimming-etching process E2 includes steps of (a) trimming the mask layer 120 shown in FIG. 3 to form a mask layer 122 with a reduced overall size (including length, width and/or height), while exposing the top surface 118a and depressed top surface 118b of another portion of the metal layer 118, and (b) performing a second etching process, e.g., dry etching and/or wet etching process, by using the mask layer 122 as an etching mask to further remove the exposed lower metal layer 118 so as to form a step 124 of the metal layer 118. In this operation, the step (a) and the step (b) are repetitively performed, so that a plurality of steps 116a, 116b and 116c of one or each of the second alignment marks 116 are formed as shown in FIG. 1B. In an embodiment, the second etching process preferably includes an anisotropic etching process, but it is not limited thereto.

Subsequently, after the second alignment marks 116 with the stepped structures are formed, the second dielectric layer 114 is formed to cover the stepped structures and then planarized, thereby completing the semiconductor device 10 in this embodiment. Those skilled in the art can readily understand that, in order to meet the practical requirements of the devices, the steps of the stepped structures can be different from one another by adjusting the etching conditions of the first etching process E1 and/or the trimming-etching process E2, such as etching time and etching selectivity. For example, in an embodiment, the heights H1, H2 and H3 of the steps 116a, 16b and 116c in the vertical direction can be different from one another by adjusting the etching time in each cycle of the trimming-etching process E2. Furthermore, in another embodiment, at least one etching process is performed on the predetermined area for forming the stepped structures before the first etching process E1, creating a different step height at least in a partial area. As a result, the steps formed at two opposite sides of one or each of the stepped structures may therefore be in different heights (not shown in the drawings), but not limited to the above-described ones.

Those ordinary in the art to which the present invention belongs could readily understand that the semiconductor device and its forming method developed according to the present invention may have alternative forms and/or can be achieved by alternative means without being limited to the foregoing, on the premise of meeting the practical requirements or products. Hereinafter, further embodiments or variations of the semiconductor device of the present invention will be described. For simplification, the following descriptions are mainly focused on the differences between embodiments, and will not repeat the similarities. In addition, the same components in various embodiments of the present invention are labeled with the same numeral references in order to facilitate mutual comparison among various embodiments.

Figure 5:
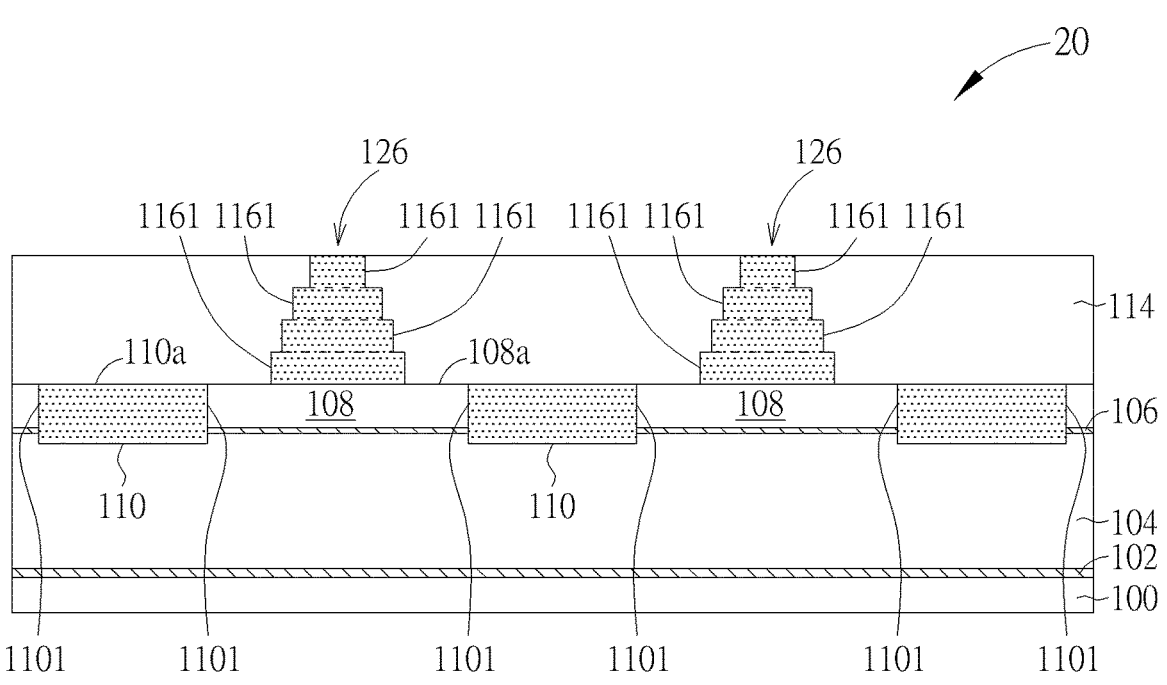
FIG. 5 is a schematic diagram illustrating a cross-sectional view of a semiconductor device according to a second embodiment of the present invention.

Please refer to FIG. 5, which is a schematic cross-sectional view of a semiconductor device 20 in a second embodiment of the present invention. The semiconductor device 20 in this embodiment has a similar structure to that of the semiconductor device 10 in the first embodiment, and the similarities are not repeated herein. The semiconductor device 20 in this embodiment differs from the semiconductor device 10 in the first embodiment in that a plurality of second alignment marks 126 and a plurality of first alignment marks 110 are alternately arranged in a first direction, e.g., the horizontal direction.

In detail, in this embodiment, the second alignment marks 126 are also in physical contact with the top surface 108a of the first dielectric layer 108, and do not overlap the first alignment marks 110 disposed underneath. Moreover, the second alignment marks 126 and the first alignment marks 110 are alternately arranged in the second dielectric layer 114, in a manner by repeatedly arranged by repeating one of the second alignment marks 126 followed by one of the first alignment marks 110. In other words, each the first alignment mark 110 is located between any adjacent two of the second alignment marks 126, as shown in FIG. 5.

Under this arrangement, the first alignment marks 110 have a plurality of first lateral edges 1101 along the first direction. Each stepped structure of the second alignment marks has a plurality of second lateral edges 1161 along the first direction, and the plurality of second lateral edges 1161 are disposed between adjacent two of the plurality of first lateral edges 1101 in the first direction. The first alignment marks 110 and the second alignment marks 126 in this embodiment also do not interfere with each other. The first alignment marks 110 can be used as zero layer marks or external marks, while the second alignment marks 126 can be used as internal marks, both facilitating the interconnection structure formed subsequently to be precisely located at the predetermined position. Therefore, the semiconductor device 20 in this embodiment can also include a precisely-positioned interconnection structure, and thus the operational performance of the semiconductor device 20 can be enhanced.

Figure 6:
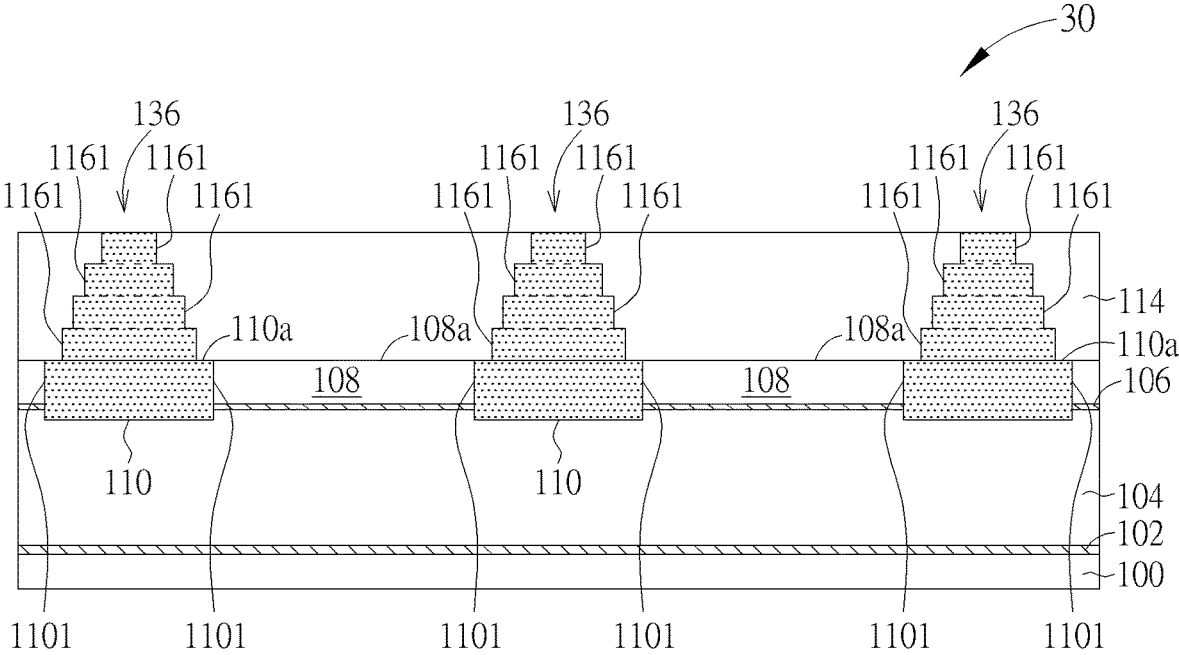
FIG. 6 is a schematic diagram illustrating a cross-sectional view of a semiconductor device according to a third embodiment of the present invention.

Please refer to FIG. 6, which is a schematic cross-sectional view of a semiconductor device 30 in a third embodiment of the present invention. The semiconductor device 30 in this embodiment has a similar structure to that of the semiconductor device 10 in the first embodiment, and the similarities are not repeated herein. The semiconductor device 30 in this embodiment differs from the semiconductor device 10 in the first embodiment in that each of the second alignment marks 136 overlaps one of the first alignment marks 110 in the vertical direction and are in physical contact with the top surface 110a of the corresponding first alignment mark 110 other than in contact with the top surface 108a of the first dielectric layer 108.

In detail, each of the second alignment marks 136 and the corresponding one of the first alignment marks 110 are overlapped in a second direction, e.g., the vertical direction, by way of alignment with respective midlines thereof. The upper second alignment marks 136 are only in contact with the top surfaces 110a of the first alignment marks 110. In contrast, the first alignment marks 110 disposed underneath are in contact with both the second alignment marks 136 and the second dielectric layer 114. That is, the surface of each of the first alignment marks 110 in contact with the second alignment marks 126 has a larger area in the horizontal direction than the area of the bottom area of the corresponding one of the second alignment marks 126 disposed thereabove, as shown in FIG. 6.

Under this arrangement, the first alignment marks 110 have a plurality of first lateral edges 1101 along the horizontal direction. Each stepped structure of the second alignment marks has a plurality of second lateral edges 1161 along the horizontal direction, and the plurality of second lateral edges 1161 are also disposed between adjacent two of the plurality of first lateral edges 1101 in the horizontal direction. Since the first alignment marks 110 are not completely covered by the second alignment marks 136 and have the top surfaces of opposite ends exposed from the second alignment marks 136, the first alignment marks 110 and the second alignment marks 136 in this embodiment also do not interfere with each other. The first alignment marks 110 can be used as zero layer marks or external marks, while the second alignment marks 136 can be used as internal marks, both facilitating the interconnection structure formed subsequently to be precisely located at the predetermined position. Therefore, the semiconductor device 30 in this embodiment can also be provided with a precisely positioned interconnection structure. Thus the operational performance of the semiconductor device 30 can be enhanced.

Figure 7:
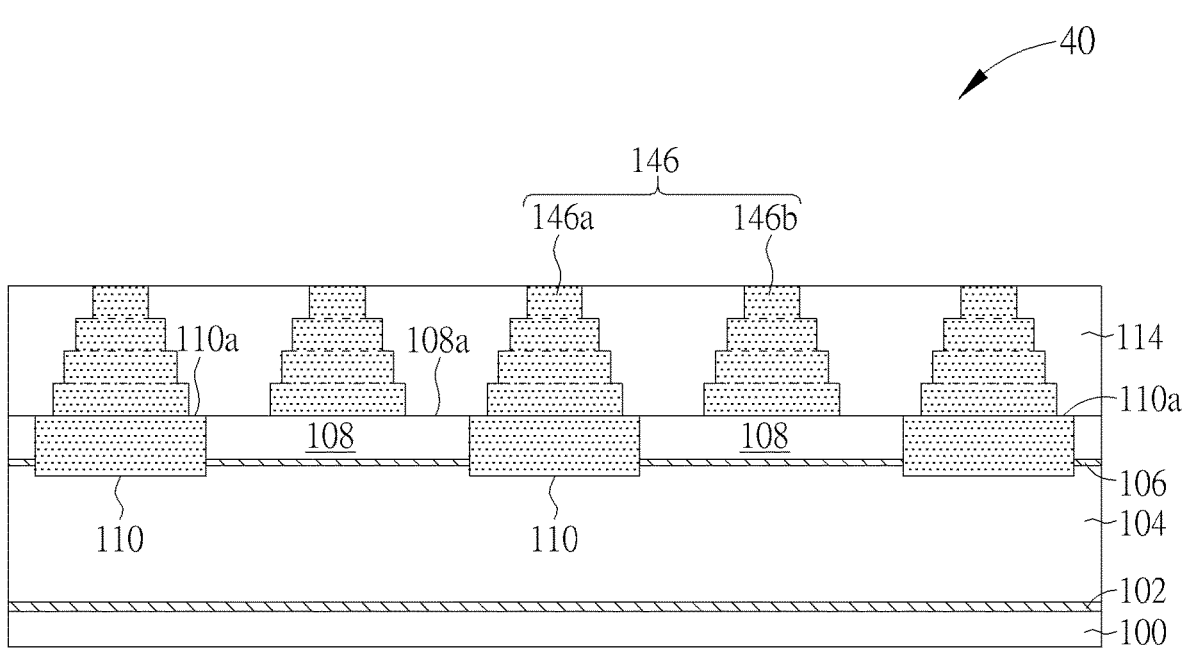
FIG. 7 is a schematic diagram illustrating a cross-sectional view of a semiconductor device according to a fourth embodiment of the present invention.

Please refer to FIG. 7, which is a schematic cross-sectional view of a semiconductor device 40 in a fourth embodiment of the present invention. The semiconductor device 40 in this embodiment has a similar structure to that of the semiconductor device 10 in the first embodiment, and the similarities are not repeated herein. The difference between the semiconductor device 40 in this embodiment and the semiconductor device 10 in the first embodiment is that among the plurality of second alignment marks 146 in this embodiment, at least one of the second alignment marks, e.g., the second alignment mark 146a, overlaps a corresponding one of the first alignment marks 110 in the vertical direction, and at least another one of the second alignment marks, e.g., the second alignment mark 146b, does not overlap with any of the first alignment marks 110 in the vertical direction.

In detail, each the second alignment mark 146a is directly located on the corresponding one of the first alignment marks 110 and only in contact with the top surface 110a of the corresponding first alignment mark 110, while the top surfaces 110a at two opposite ends of the corresponding first alignment mark 110 under the second alignment mark 146a are exposed from the second alignment mark 146a. Each the second alignment mark 146b is located between adjacent two of the first alignment marks 110 and in physical contact with the top surface 108a of the first dielectric layer 108. Two or more second alignment marks 146b, if present, are alternately arranged with two or more of the first alignment marks 110 in the horizontal direction.

Under this arrangement, the first alignment marks 110 and the second alignment marks 146 in this embodiment also do not interfere with each other. The first alignment marks 110 can be used as zero layer marks or external marks, while the second alignment marks 146 can be used as internal marks, both facilitating the interconnection structure formed subsequently to be precisely located at the predetermined position. Therefore, the semiconductor device 40 in this embodiment can also be provided with a precisely positioned interconnection structure. Thus the operational performance of the semiconductor device 40 can be enhanced.

Figure 8:
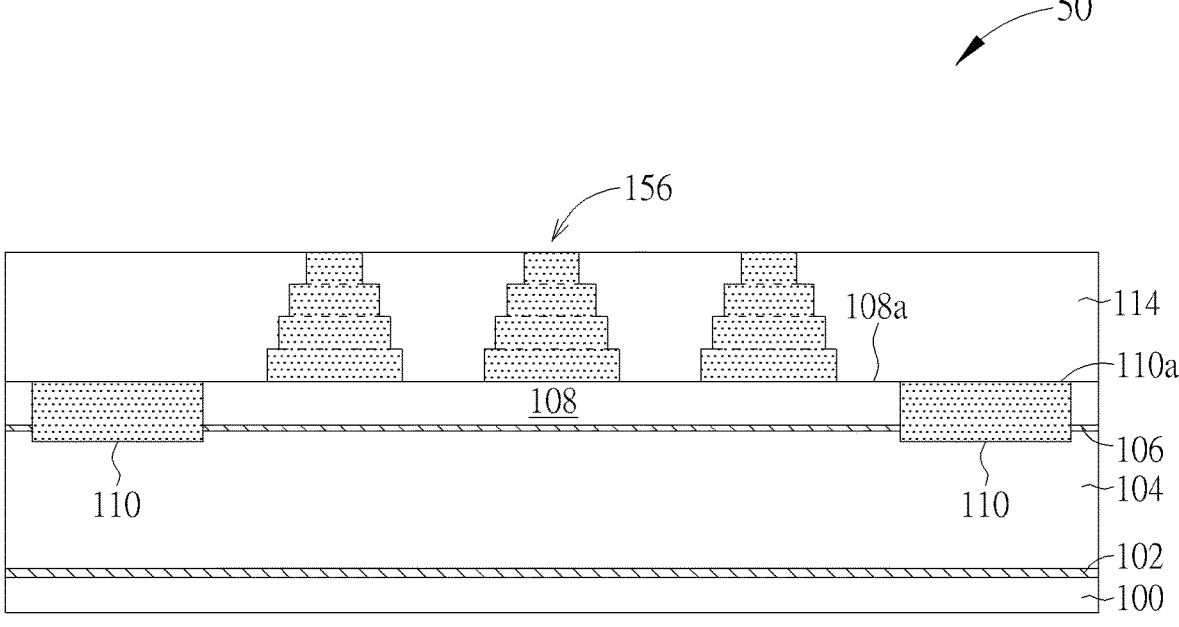
Figure 9:
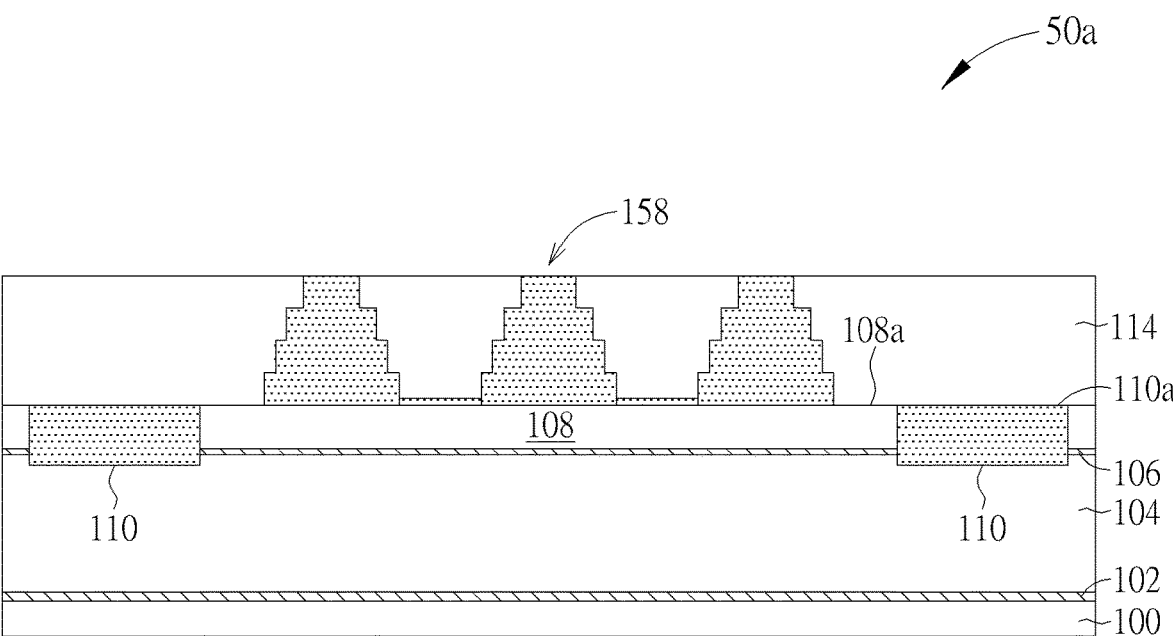

Please refer to FIG. 8 and FIG. 9, which are schematic cross-sectional views of semiconductor devices 50 and 50a according to a fifth embodiment of the present invention. The semiconductor devices 50 and 50a in this embodiment have similar structures to the semiconductor device 10 in the aforementioned first embodiment, and the similarities are not repeated herein. The semiconductor devices 50 and 50a in this embodiment are different from the semiconductor device 10 in the first embodiment in that more than one second alignment mark 156 or more than one second alignment mark 158, which do not overlap any of the first alignment marks 110 in the vertical direction, are arranged between adjacent two of the first alignment marks 110 in the horizontal direction.

In detail, the second alignment marks 156 and 158 are located on the first dielectric layer 108 and only in physical contact with the top surface 108a of the first dielectric layer 108. A plurality of second alignment marks 156 are located between adjacent two of the first alignment marks 110 and are, for example, spaced apart from each other so that the top surface 108a of the first dielectric layer 108 is partially exposed in the area between adjacent second alignment marks 156, as shown in FIG. 8. On the other hand, a plurality of second alignment marks 158 located between adjacent two of the first alignment marks 110 are, for example, connected to each other, as shown in FIG. 9. The configuration may also be regarded as an integrated single second alignment mark 158 with multiple stepped structures.

Under this arrangement, the first alignment marks 110 and the second alignment marks 156/158 in this embodiment also do not interfere with each other. The first alignment marks 110 can be used as zero layer marks or external marks, while the second alignment marks 156/158 can be used as internal marks, both facilitating the interconnection structure formed subsequently to be precisely located at the predetermined position. Therefore, the semiconductor device 50/50a in this embodiment can also be provided with a precisely positioned interconnection structure. Thus the operational performance of the semiconductor device 50/50a can be enhanced.

Figure 10:
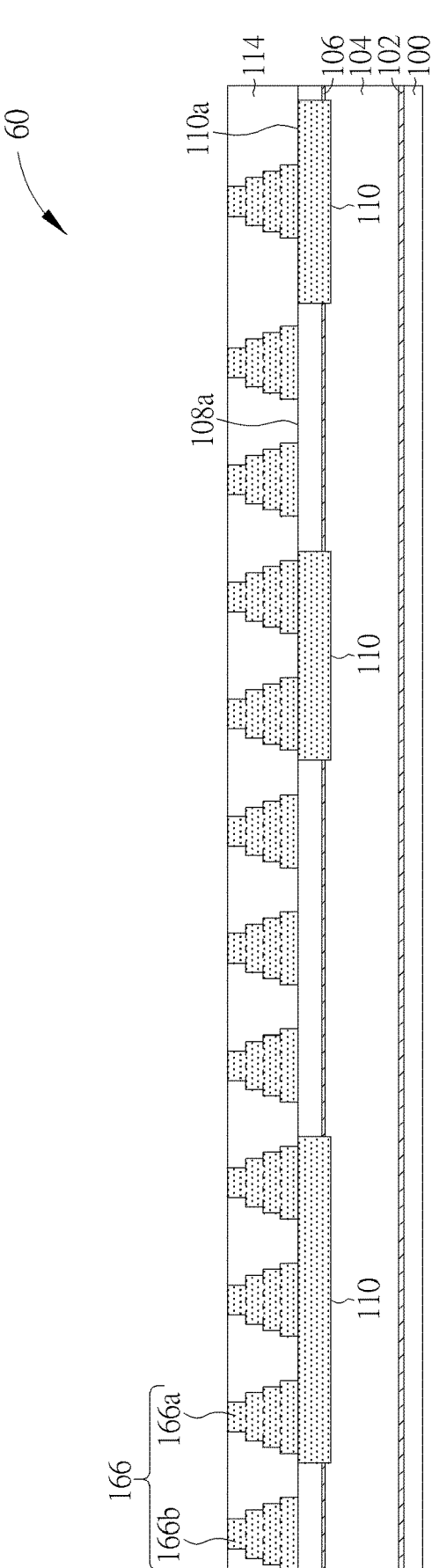
FIG. 10 is a schematic diagram illustrating a cross-sectional view of a semiconductor device according to a sixth embodiment of the present invention.

Please refer to FIG. 10, which is a schematic cross-sectional view of a semiconductor device 60 in a sixth embodiment of the present invention. The semiconductor device 60 in this embodiment has a similar structure to that of the semiconductor device 10 in the first embodiment, and the similarities are not repeated herein. The semiconductor device 60 in this embodiment differs from the semiconductor device 10 in the first embodiment in that a plurality of second alignment marks 166 in this embodiment include some second alignment marks 166*a* overlapping corresponding ones of the first alignment marks 110 in the vertical direction, while other second alignment marks 166*b* do not overlap any of the first alignment marks 110 in the vertical direction.

In detail, one or more second alignment marks 166*a* are located on the same first alignment mark 110 and only in contact with the top surface 110*a* of the corresponding first alignment mark 110, while at least partially exposing the top surfaces 110*a* at two opposite ends of the first alignment mark 110 disposed underneath. Furthermore, one or more second alignment marks 166*b* are located between adjacent two of the first alignment marks 110 and in physical contact with the top surface 108*a* of the first dielectric layer 108.

Under this arrangement, the first alignment marks 110 and the second alignment marks 166 in this embodiment also do not interfere with each other. The first alignment marks 110 can be used as zero layer marks or external marks, while the second alignment marks 166 can be used as internal marks, both facilitating the interconnection structure formed subsequently to be precisely located at the predetermined position. Therefore, the semiconductor device 60 in this embodiment can also be provided with a precisely positioned interconnection structure. Thus the operational performance of the semiconductor device 60 can be enhanced.

In general, the semiconductor device of the present invention includes a plurality of first alignment marks arranged below and a plurality of second alignment marks with stepped structures disposed above, wherein the first alignment marks and the second alignment marks are respectively arranged in a first dielectric layer and a second dielectric layer which are sequentially stacked. In the present invention, the bottom surfaces of the second alignment marks are in physical contact with the coplanar surface of the first alignment marks and the first dielectric layer, so that each of the second alignment marks is only in physical contact with a single material, such as a metal material of the corresponding first alignment mark or a dielectric material of the first dielectric layer. In this way, the first alignment marks and the second alignment marks will not interfere with each other so that the interconnection structure formed subsequently can be precisely disposed in the semiconductor device.

Figure 11:
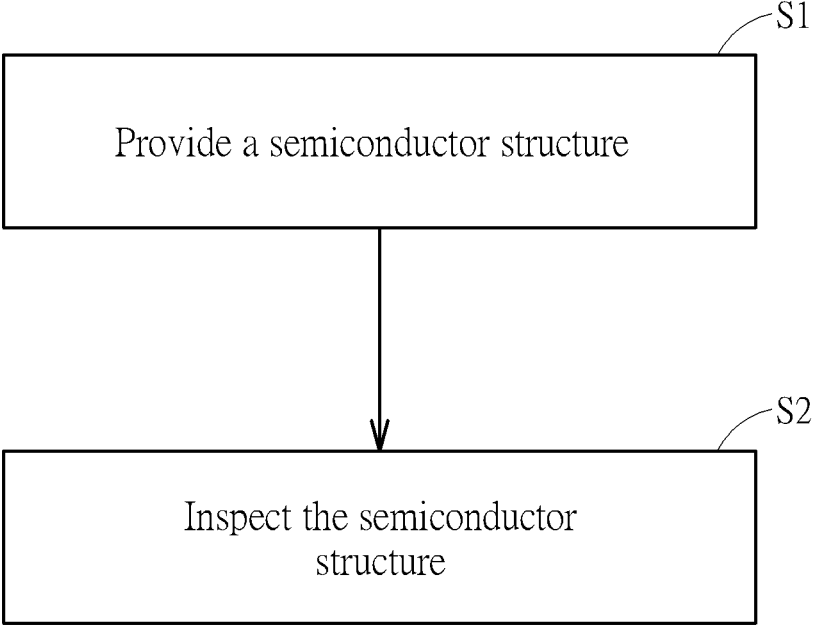
Figure 12:
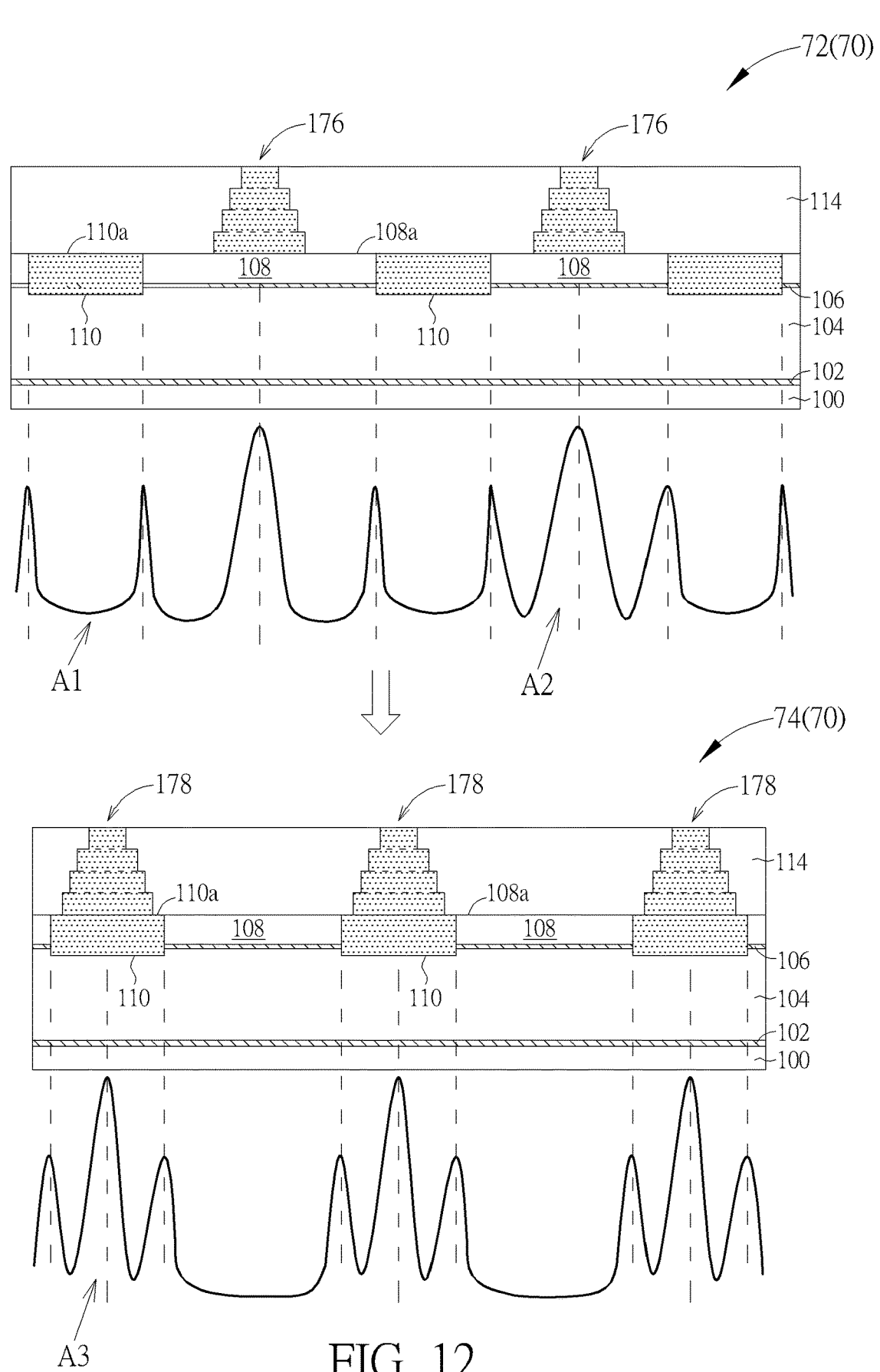

Furthermore, the semiconductor device according to the present invention can be subjected to inspection. By detecting material changes between components in the semiconductor device with an inspecting machine (not shown in the drawings), the positions of the alignment marks in the semiconductor device can be located and defined. Please refer to FIG. 11 and FIG. 12. FIG. 11 and FIG. 12 are schematic diagrams showing the method of measuring a semiconductor device according to a preferred embodiment of the present invention.

In this embodiment, the method of measuring a semiconductor device includes, but is not limited to, the following processes. First, as shown in FIG. 11 and FIG. 12, a semiconductor structure 70 is provided (process S1). The semiconductor structure 70 includes a first semiconductor structure 72 and a second semiconductor structure 74, but it is not limited thereto. Each of the first semiconductor structure 72 and the second semiconductor structure 74 includes a substrate 100, a plurality of alignment marks 110 and a plurality of stepped structures 176 and 178. The first semiconductor structure 72 includes, for example, the structure illustrated in the aforementioned second embodiment with reference to FIG. 5, which includes a first substrate 100, a plurality of alignment marks 110 arranged on the first substrate 100, and a plurality of first stepped structures 176 arranged above the alignment marks 110. The plurality of first stepped structures 176 do not overlap the lower alignment marks 110 and are respectively arranged between adjacent two of the alignment marks 110. The second semiconductor structure 74 includes, for example, the structure shown in the aforementioned third embodiment (as shown in FIG. 6), which includes a second substrate 100, a plurality of alignment marks 110 arranged on the second substrate 100, and a plurality of second stepped structures 178 arranged above the alignment marks 110. Each of the plurality of second stepped structures 178 overlap one of the alignment marks 110 in the vertical direction and in physical contact with the top surface 110*a* of the corresponding alignment mark 110.

Afterwards, the semiconductor structure 70 is inspected (process S2) with an inspection machine (not shown) to define positions where material varied from other in the semiconductor structure 70 followed by generating a corresponding signal. For example, the aforementioned positions refer to where the alignment marks 110 of a metal material abut the first substrate 100 or the second substrate 100 of a semiconductor material or dielectric material, and/or the positions where the first stepped structures 176 or second stepped structures 178 of a metal material abut the first substrate 100 or the second substrate 100 of a semiconductor material or dielectric material. As shown in FIG. 12, the process S2 includes, in detail, inspecting the first semiconductor structure 72 with the inspection machine and inspecting the second semiconductor structure 74 with the inspection machine. The inspection machine generates two peaks respectively corresponding to two opposite sides of each the alignment mark 110 on the first substrate 100. A first signal A1 is thus defined from the two peaks associated with the alignment mark 110. In addition, another peak corresponding to each the first stepped structure 176 is further generated to define a second signal A2. Furthermore, the inspection machine generates consecutive peaks corresponding to the second stepped structures 178 on the second substrate 100 to define a third signal A3. Subsequently, the position of the alignment mark 110 and/or the first stepped structure 176 on the first substrate 100 and the position of the alignment mark 110 and/or the second stepped structure 178 on the second substrate 100 can be defined by measuring the first signal A1, the second signal A2 and the third signal A3. That is, the method of measuring a semiconductor device according to the present invention enables to precisely define the positions of the alignment mark 110, the first stepped structure 176 and the second stepped structure 178 in the semiconductor device 70.

It is to be noted that in the second semiconductor structure 74, each second stepped structure 178 overlaps one of the alignment marks 110 on the second substrate 100, and the peak intensity of the third signal A3 is obviously different from that of the second signal A2, as shown in FIG. 12. Therefore, in one embodiment, the method of measuring a semiconductor device may further include a filtering process (not shown in the drawings), in which the first signal A1, the second signal A2 and the third signal A3 are combined to define a filtering signal (not shown in the drawings). The position of the alignment mark 110 on the first substrate 100 can be located more precisely and the accuracy of the measurement method can be improved by excluding the overlapped alignment mark 110 or second stepped structure 178 based on the filtering signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a first dielectric layer disposed on the substrate;
a plurality of first alignment marks disposed in the first dielectric layer and having a plurality of first lateral edges along a first direction;
a second dielectric layer disposed on the first dielectric layer; and
a plurality of second alignment marks disposed in the second dielectric layer and spaced apart from each other, each of the plurality of second alignment marks having a stepped structure, wherein the stepped structure has a plurality of second lateral edges along the first direction, and the plurality of second lateral edges are disposed between adjacent two of the plurality of first lateral edges in the first direction.

2. The semiconductor device according to claim 1, wherein the bottom surface of each of the plurality of second alignment marks is in physical contact only with a material of one of the plurality of first alignment marks or a material of the first dielectric layer.

3. The semiconductor device according to claim 2, wherein at least one of the plurality of second alignment marks is disposed between adjacent two of the plurality of first alignment marks and overlaps the first dielectric layer.

4. The semiconductor device according to claim 2, wherein at least one of the plurality of second alignment marks is alternately arranged with at least one of the plurality of first alignment marks and does not overlap any of the plurality of first alignment marks in a vertical direction.

5. The semiconductor device according to claim 3, wherein at least another one of the plurality of second alignment marks overlaps a corresponding one of the plurality of first alignment marks in the vertical direction.

6. The semiconductor device according to claim 3, wherein the at least one of the plurality of second alignment marks comprises a plurality of stepped structures connected with each other.

7. The semiconductor device according to claim 2, wherein at least one of the plurality of second alignment marks overlaps a corresponding one of the plurality of first alignment marks in a vertical direction.

8. The semiconductor device according to claim 2, wherein more than one of the plurality of first alignment marks are disposed between adjacent two of the plurality of second alignment marks and the top surfaces of the more than one of first alignment marks are in contact with the same material.

* * * * *